United States Patent
Liu et al.

(10) Patent No.: US 8,473,872 B2
(45) Date of Patent: Jun. 25, 2013

(54) GRADIENT-BASED SEARCH MECHANISM FOR OPTIMIZING PHOTOLITHOGRAPH MASKS

(75) Inventors: Ying Liu, Austin, TX (US); Sani R. Nassif, Austin, TX (US); Xiaokang Shi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/531,811

(22) Filed: Jun. 25, 2012

(65) Prior Publication Data

US 2012/0278769 A1    Nov. 1, 2012

Related U.S. Application Data

(63) Continuation of application No. 12/536,090, filed on Aug. 5, 2009, now Pat. No. 8,245,159.

(51) Int. Cl.
   G06F 17/50    (2006.01)
(52) U.S. Cl.
   USPC ............... 716/50; 716/51; 716/52; 716/53; 716/54; 716/55
(58) Field of Classification Search
   USPC ....................................... 716/50–56
   See application file for complete search history.

(56) References Cited

U.S. PATENT DOCUMENTS

| | | | |
|---|---|---|---|
| 2007/0032896 A1 | 2/2007 | Ye et al. | |
| 2011/0035709 A1 | 2/2011 | Liu et al. | |
| 2011/0119642 A1* | 5/2011 | Agarwal et al. | 716/50 |

OTHER PUBLICATIONS

U.S. Appl. No. 12/536,090.
U.S. Appl. No. 13/531,703.
U.S. Appl. No. 13/531,733.
U.S. Appl. No. 13/531,754.
U.S. Appl. No. 13/531,778.
U.S. Appl. No. 13/531,831.
Poonawala, A. et al., "Mask Design for Optical Microlithography—An Inverse Imaging Problem", IEEE Transactions on Image Processing, vol. 16, Issue 3, Mar. 2007, pp. 774-788.
Sherif, S, et al., "Binary image synthesis using mixed linear integer programming", IEEE Transactions on Image Processing, vol. 4, Issue 9, Sep. 1995, pp. 1252-1257, Abstract.
Ex Parte Quayle Office Action mailed Oct. 26, 2012 for U.S. Appl. No. 13/531,733; 4 pages.
Ex Parte Quayle Office Action mailed Nov. 14, 2012 for U.S. Appl. No. 13/531,733; 4 pages.

(Continued)

*Primary Examiner* — Paul Dinh
(74) *Attorney, Agent, or Firm* — Francis Lammes; Stephen J. Walder, Jr.; Eustus D. Nelson

(57) ABSTRACT

A mechanism is provided for optimizing a photolithograph mask. A given target pattern is received. An initial fictitious mask is generated from the given target pattern and an initial value of $\alpha_2$ is selected where the initial value of $\alpha_2$ is used to determine a light intensity and a wafer image. The light intensity for each pixel in the initial fictitious mask and the wafer image for each pixel in the initial fictitious mask are then determined. A determination is then made as to whether a convergence has been achieved by comparing the wafer image generated from the fictitious mask to the given target pattern. Responsive to a convergence of the wafer image generated from the fictitious mask to the given target pattern, a final mask is generated to use to transfer an image to a wafer.

3 Claims, 5 Drawing Sheets

OTHER PUBLICATIONS

Office Action mailed Aug. 21, 2012 for U.S. Appl. No. 13/531,733; 7 pages.
Office Action mailed Sep. 17, 2012 for U.S. Appl. No. 13/531,831; 9 pages.
Response to Office Action filed Oct. 11, 2012, U.S. Appl. No. 13/531,733, 10 pages.
Response to Office Action filed Nov. 6, 2012, U.S. Appl. No. 13/531,733, 7 pages.
Response to Office Action filed Nov. 8, 2012 for U.S. Appl. No. 13/531,831; 13 pages.

* cited by examiner

702

GRADIENT-BASED SEARCH MECHANISM FOR OPTIMIZING PHOTOLITHOGRAPH MASKS

This application is continuation of application Ser. No. 12/536,090, filed Aug. 5, 2009, now U.S. Pat. No. 8,245,159 B2. This application is also related to application Ser. Nos. 13/531,703, 13/531,733, 13/531,754, 13/531,778, and 13/531,831, all filed Jun. 25, 2012.

BACKGROUND

The present application relates generally to an improved data processing apparatus and method and more specifically to an apparatus and method for a gradient-based search mechanism for optimizing photolithograph masks.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as wet or dry etching.

The resolution of the photo-lithography system (R) can be described by the well-known Rayleigh's equation:

$$R = \frac{k_1 \lambda}{NA}$$

in which $\lambda$ is the wavelength of the light source, NA is the numerical aperture and $k_1$ is the factor describing the complexity of resolution enhancement techniques. As the very-large-scale integration (VLSI) technology pushes further into nanometer region, the feasible wavelength of the photo-lithographic system remains unchanged at 193 nm. Although there is anticipation that extreme ultraviolet lithography (EUVL) with the wavelength of 13 nm will replace traditional optical lithography, the availability of EUVL remains uncertain due to technical challenges and cost issues. On the other hand, the physical limit of dry lithography of NA is 1.0. The recently introduced immersion lithography has bigger NA (1.2), but it is harder to achieve higher NA values. Thus it is commonly recognized that $k_1$ remains a cost effective knob to achieve finer resolution.

Due to the unavoidable diffraction, the optical lithography system is lossy in the sense that only low frequency components of the electromagnetic field can pass the optical system. As the gap between the required feature size and lithography wavelength gets bigger, the final wafer images are quite different from the patterns on the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Other commonly used RETs are sub-wavelength resolution assist features (SRAF) and phase-shift masks (PSM). Nowadays, considerable amount of computing power has to be dedicated to these post-layout processes (often referred as data prep). Large computer farms have to spend weeks of central processing unit (CPU) time to perform data prep after a design is completed. However, all these RET methods have one significant drawback: there is no guarantee the achieved results will be optimal. Furthermore, as the technology is further pushed, manufacturing variations (e.g., dose and focus variations during the lithograph steps) have to be considered. However, it is quite challenging to systematically incorporate the process variations into the traditional RETs.

On the other hand, this particular problem can be considered from a different angle. Instead of locally perturbing the pattern to compensate for the loss, the mask pattern may be treated as the input to the optical system, and the wafer image as the output. The task then becomes how to "design" a mask so that the desired wafer image can be formed. This concept is often referred as "image design", and was proposed over 20 years ago. However, the problem itself is often ill-posed in the sense that more than one input can generate the same output. It can be shown that the size of the search space is well over $2^{1,000,000}$, which is even larger than the number of atoms in the observable universe. There were some early attempts to find a feasible solution to this problem by using method such as simulated annealing, genetic algorithms, and random pixel flipping. In recent years, the growing challenges facing sub-wavelength lithography and the ever increasing complexity of traditional RETs have made this idea more attractive, which is often referred as "inverse lithography" or "computational lithography". A gradient search based method was proposed to overcome the excessive computational cost. However, the proposed method used non-realistic assumptions regarding the optical system (incoherent and coherent), while it is well-recognized that partially coherent models are the only acceptable model for the optical lithography system. Furthermore, the method was not demonstrated in a true industrial lithography environment.

SUMMARY

In one illustrative embodiment, a method, in a data processing system, is provided for optimizing a photolithograph mask. The illustrative embodiments receive a given target pattern. The illustrative embodiments generate an initial fictitious mask and select an initial value of $\alpha_2$. In the illustrative embodiments, the initial value of $\alpha_2$ is used to determine a light intensity and a wafer image. The illustrative embodiments determine the light intensity for each pixel in the initial fictitious mask. The illustrative embodiments determine the wafer image for each pixel in the initial fictitious mask. The illustrative embodiments determine if a convergence has been achieved by comparing the wafer image generated from the fictitious mask to the given target pattern. The illustrative embodiments generate a final mask to use to transfer an image to a wafer in response to a convergence of the wafer image generated from the fictitious mask to the given target pattern.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
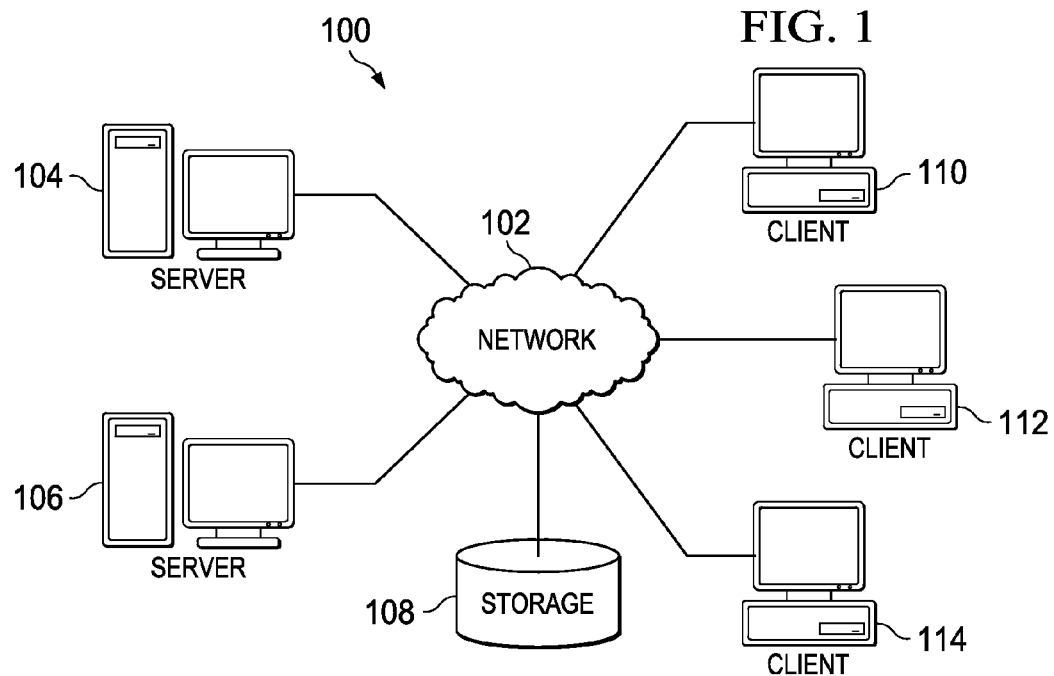
FIG. 1 depicts a pictorial representation of an example distributed data processing system in which aspects of the illustrative embodiments may be implemented.

The illustrative embodiments provide a mechanism for general optimization for inverse lithography. The illustrative embodiment applies two transformations to convert a optimization function from discrete domain to continuous domain so that a more efficient gradient searching method can be used. Realistic models (partially coherent) are used for the optical system and an efficient gradient calculation method using fast Fourier transform (FFT) is derived. Furthermore, the proposed transformation enables a gradual morph of the function from continuous to discrete, thus ensuring the optimality of the final solution.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In addition, the program code may be embodied on a computer readable storage medium on the server or the remote computer and downloaded over a network to a computer readable storage medium of the remote computer or the users' computer for storage and/or execution. Moreover, any of the computing systems or data processing systems may store the program code in a computer readable storage medium after having downloaded the program code over a network from a remote computing system or data processing system.

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
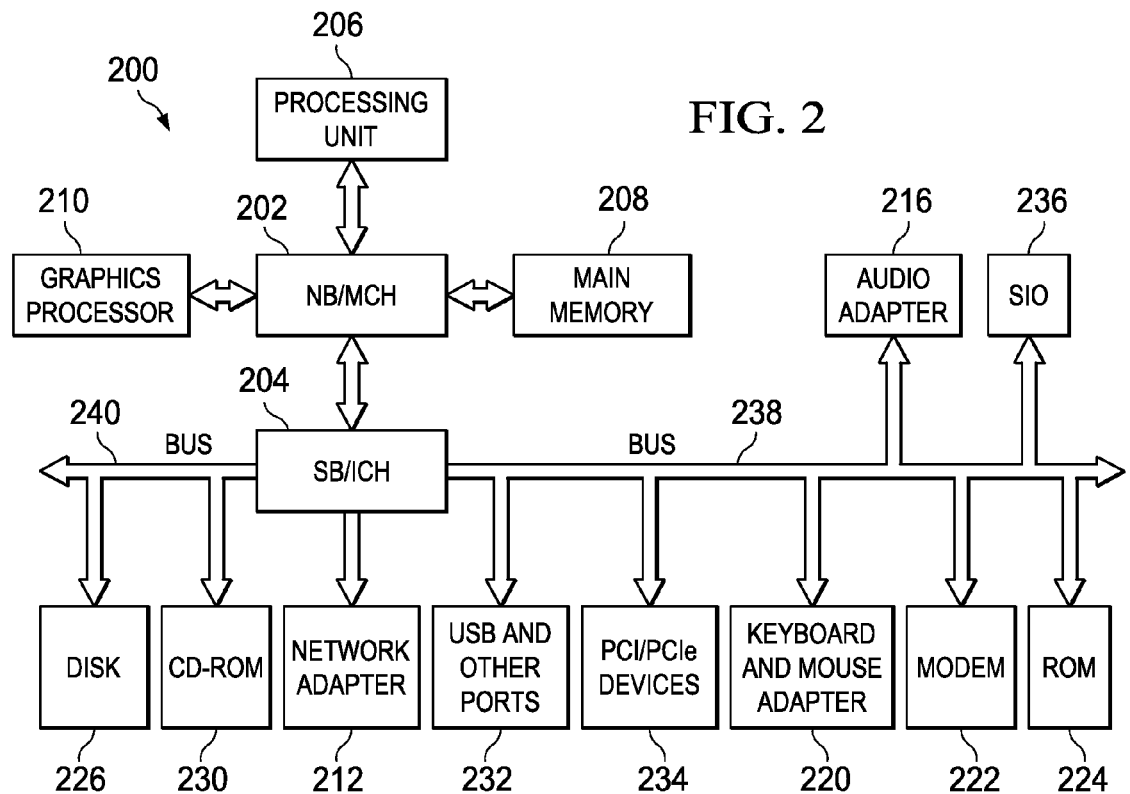
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. While the description following FIGS. 1 and 2 will focus primarily on a single data processing device implementation of a gradient-based search mechanism for optimizing photolithograph masks, this is only an example and is not intended to state or imply any limitation with regard to the features of the present invention. To the contrary, the illustrative embodiments are intended to include distributed data processing environments and embodiments in which photolithograph masks may be optimized using a gradient-based search mechanism.

With reference now to the figures and in particular with reference to FIGS. 1-2, example diagrams of data processing environments are provided in which illustrative embodiments of the present invention may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

Figure 3:
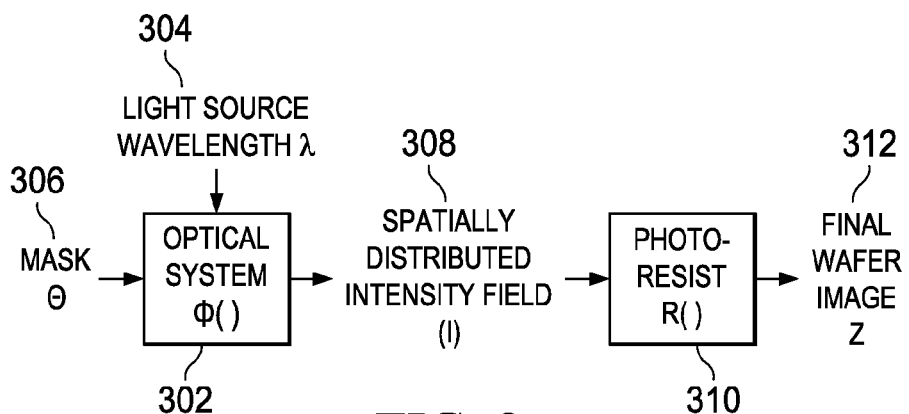
FIG. 3 illustrates a highly simplified schematic view of a state-of-the-art optical lithography process.

FIG. 3 illustrates a highly simplified schematic view of a state-of-the-art optical lithography process. In optical system ($\Phi()$) 302, light source 304 of wavelength $\lambda$ projects through received mask ($\Theta$) 306 to achieve a spatially distributed intensity field (I) 308 on the wafer source. After chemical reactions of photo-resist (R( )) 310 on the wafer source, final wafer image (Z) 312 forms on the wafer source.

One problem of inverse lithography is to find a mask pattern (among an unknown number of solutions) so that the final wafer image is as close to a predefined pattern as possible. Because the mask has a limited resolution, it is usually spatially sampled. Thus, the illustrative embodiment focus on traditional binary mask. Therefore, the value at each mask pixel may be either 0 or 1. On the other hand, the wafer image is also sampled at certain grid. Assuming the number of grids in x and y direction are M and N, respectively. The exact values of M and N depend on the resolution and the size of the optical dimension (OD). For the state-of-the-art sub-wavelength lithography, the values of M and N may easily exceed 1,000. Therefore, if treated as a discrete optimization function, the size of the search space is over $2^{1,000,000}$. Thus, any brute-force method quickly becomes intractable.

Figure 4:
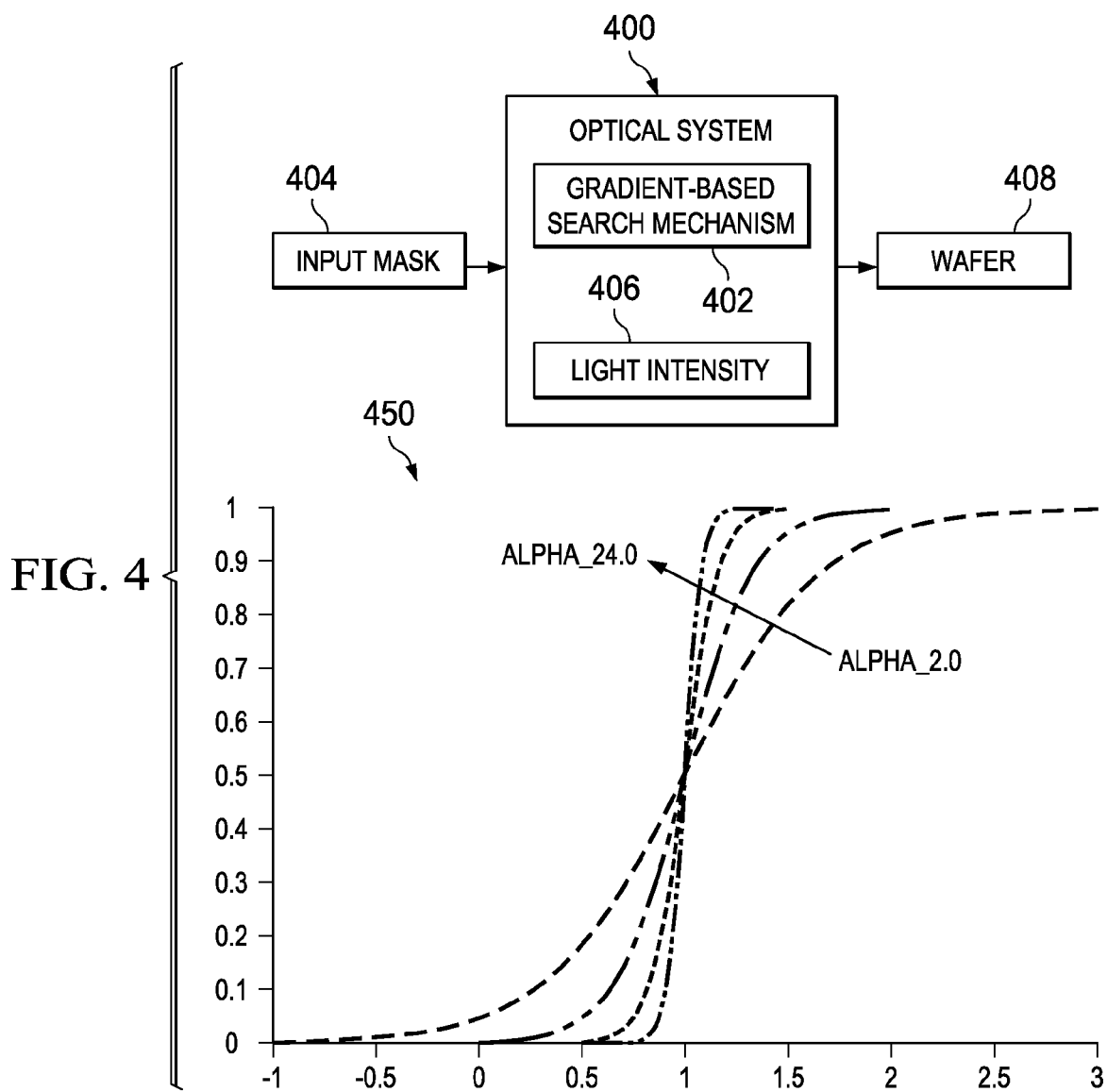
FIG. 4 depicts an optical system that uses a gradient-based search mechanism for optimizing photolithograph masks for a given target pattern in accordance with an illustrative embodiment.

FIG. 4 depicts an optical system that uses a gradient-based search mechanism for optimizing photolithograph masks for a given target pattern in accordance with an illustrative embodiment. Gradient-based search mechanism 402 in optical system 400 uses an objective function to quantify the goodness of input mask 404, which may be referred to as an initial photolithographic mask. Gradient-based search mechanism 402 uses the "sum of pixel difference" as the optimization objective function $F(\theta)$, which is defined as:

$$F(\theta) = \frac{1}{MN} \sum_{j=1}^{MN} (\hat{z}_j - z_j)^2$$

where $\hat{z}_j$ is predefined as the desired pattern on the wafer surface, where $z_j$ represents the actual wafer image generated by the given mask, where j is the pixel location within the grid, where M is a number of grids in a x direction, and where N is a number of grids in a y direction. Therefore, the mask optimization function may be summarized as:

Finding $\theta_j$, j=1, 2, ..., M N, such that $F(\theta)$ is minimized, with $\theta_j \in \{0, 1\}$ and $z_j \in \{0, 1\}$ Although the mask optimization function may be a discrete function, the discrete function size is quite large, therefore, blindly applying a discrete optimization package may not always be feasible. Thus, gradient-based search mechanism 402 uses transformations so that the discrete function may be converted to continuous domain, so that more efficient optimization methods may be applied.

In order to transform the function into a continuous function, gradient-based search mechanism 402 uses two transformations. In the first transformation, gradient-based search mechanism 402 transforms light intensity 406 on the surface of wafer 408 to binary wafer image. In other words, the binary wafer image is practically the photo-resist model itself. Gradient-based search mechanism 402 uses a function that is a $C_1$ function (with continuous first-order derivatives) so that the gradient may be calculated, which is defined as follows:

$$S_1(\theta; \alpha_1, t_r) = \frac{1}{1 + e^{-\alpha_1 \theta + \alpha_1 t_r}}$$

where tr is a predefined constant photo-resist (CTR) threshold value. The value of $\alpha_1$ determines how "steep" the function is. The bigger value $\alpha_1$ is, the closer it is to the step function. However, regardless of the choice of $\alpha_1$, function $S1(\cdot)$ is always a $C_1$ function.

Gradient-based search mechanism 402 uses a second transformation to transform the function to a continuous domain, so that more efficient optimization methods may be used. In other words, instead of optimizing the true binary mask, gradient-based search mechanism 402 perform the optimization on a fictitious continuous mask and uses the transformation to translate the fictitious mask into discrete domain. Since the transformation is one-to-one, gradient-based search mechanism 402 easily identifies the desired binary mask. Gradient-based search mechanism 402 uses the following logistic function to transform the function to continuous domain:

$$S_2(\theta; \alpha_2) = \frac{1}{1 + e^{-\alpha_2 \theta}}$$

It is clear that this transformation is also a $C_1$ function, thus gradient-based search mechanism 402 may easily calculate the gradient. A benefit of using the second transformation function is that gradient-based search mechanism 402 may dynamically "tune" the value of $\alpha_2$. Graph 450 illustrates that the smaller the value $\alpha_2$ is, the "softer" the function is. The bigger the value of $\alpha_2$, the "harder" (or closer to discrete) the function becomes. As $\alpha_2$ gets sufficiently large, the function becomes almost completely discrete. The value of $\alpha_2$ may be considered sufficiently large when $\alpha_2$ is either within a predetermined range of a predetermined value or equals the predetermined value. Therefore, gradient-based search mechanism 402 starts with a smaller $\alpha_2$ value and gradually increases the "stiffness" of the function by increasing $\alpha_2$. Using such a strategy helps to ensure the optimality of the final result.

In order to apply an efficient optimization method, gradient-based search mechanism 402 first calculates a gradient. In order to calculate the gradient, gradient-based search mechanism 402 calculates the derivative of the objective function $F(\bullet)$ with respect to pixel $\theta_j$. Note that the objective function is:

$$F(\theta) = \frac{1}{MN} \sum_{j=1}^{MN} (\hat{z}_j - z_j)^2$$

where $\theta = [\theta_1, \eta_2, \ldots \theta_{MN}]$ defines the mask. Gradient-based search mechanism 402 then applies the following CTR equation:

$$S_1(\theta; \alpha_1, t_r) = \frac{1}{1 + e^{-\alpha_1 \theta + \alpha_1 t_r}}$$

so that the objective function becomes:

$$F(\theta) = \frac{1}{MN} \sum_{j=1}^{MN} (\hat{z}_j - S_1(I_j))^2$$

where $I_j$ is the light intensity at pixel location j. Gradient-based search mechanism 402 may then calculate the light intensity at location j using the following formula:

$$I_j = \sum_{k=1}^{m} \sigma_k \left\| \sum_{i=1}^{MN} \phi_{ijk} S_2(\theta_i) \right\|^2$$

by applying the second transformation of:

$$S_2(\theta; \alpha_2) = \frac{1}{1 + e^{-\alpha_2 \theta}}$$

Therefore, the support of $\theta_i$ is $(-\infty, +\infty)$. In these equations, $I_j$ is the light intensity at pixel location j, $\theta$ is a specific pixel, m is an eigenvector of the kernel, M is a number of grids in a x direction, N is a number of grids in a y direction, $S_2$ is a logistic function, $\sigma$ is the eigenvalue of the optical kernel function, $\phi$ is eigenvector of the optical kernel function, k is the kernel index, and i is the grid index.

Gradient-based search mechanism 402 then calculates the gradient of the sum of pixel differences F with respect to the mask at location p using the following formula:

$$\frac{\partial}{\partial \theta_p} F(\theta) =$$

$$-2 \sum_{j=1}^{MN} (\hat{z}_j - z_j) S_1'(I_j) \sum_{k=1}^{m} \sigma_k \cdot \cdot \left[ \frac{\partial}{\partial \theta_p} \sum_{i=1}^{MN} \phi_{ijk} S_2(\theta_i) \cdot \sum_{i=1}^{MN} \phi_{ijk}^* S_2(\theta_i) + + \right.$$

$$\left. \sum_{i=1}^{MN} \phi_{ijk} S_2(\theta_i) \cdot \frac{\partial}{\partial \theta_p} \sum_{i=1}^{MN} \phi_{ijk}^* S_2(\theta_i) \right]$$

Note that in the above equation, gradient-based search mechanism 402 substitutes any complex number c, $|c|^2 = c \cdot c^*$, where * denotes complex conjugate operator.

If gradient-based search mechanism 402 lets $$\frac{\partial}{\partial \theta_p} \sum_{i=1}^{MN} \phi_{ijk} S_2(\theta_i) = \phi_{pjk} S_2'(\theta_p)$$

and $$\frac{\partial}{\partial \theta_p} \sum_{i=1}^{MN} \phi_{ijk}^* S_2(\theta_i) = \phi_{pjk}^* S_2'(\theta_p)$$

then:

$$\frac{\partial}{\partial \theta_p} F(\theta) = -2 \sum_{j=1}^{MN} (\hat{z}_j - z_j) S_1'(I_j)$$

$$\sum_{k=1}^{m} \sigma_k \cdot \cdot \left[ \phi_{pjk} S_2'(\theta_p) \sum_{i=1}^{MN} \phi_{ijk}^* S_2(\theta_i) + + \sum_{i=1}^{MN} \phi_{ijk} S_2(\theta_i) \phi_{pjk}^* S_2'(\theta_p) \right]$$

-continued $$\frac{\partial}{\partial \theta_p} F(\theta) = -2 S'_2(\theta_p) \sum_{j=1}^{MN} (\hat{z}_j - z_j) S'_1(I_j) \cdot$$

$$\cdot \sum_{k=1}^{m} \sigma_k \left[ \phi_{pjk} \sum_{i=1}^{MN} \phi^*_{ijk} S_2(\theta_i) + + \sum_{i=1}^{MN} \phi_{ijk} S_2(\theta_i) \phi^*_{pjk} \right]$$

$$\frac{\partial}{\partial \theta_p} F(\theta) = -2 S'_2(\theta_p) \sum_{k=1}^{m} \sigma_k \sum_{j=1}^{MN} (\hat{z}_j - z_j) S'_1(I_j) \cdot \cdot \left[ \phi_{pjk} \sum_{i=1}^{MN} \phi^*_{ijk} S_2(\theta_i) + + \sum_{i=1}^{MN} \phi_{ijk} S_2(\theta_i) \phi^*_{pjk} \right]$$

When gradient-based search mechanism 402 separates the contribution of each kernel k in the sum-of-coherent-system model, then:

$$\frac{\partial}{\partial \theta_p} F(\theta) = -2 \sum_{k=1}^{m} \sigma_k S'_2(\theta_p)$$

$$\sum_{j=1}^{MN} (\hat{z}_j - z_j) S'_1(I_j) \cdot \cdot \left[ \phi_{pjk} \sum_{i=1}^{MN} \phi^*_{ijk} S_2(\theta_i) + + \sum_{i=1}^{MN} \phi_{ijk} S_2(\theta_i) \phi^*_{pjk} \right]$$

Note that inner most summation actually defines the field at location j due to the contribution of kernel k. To simplify the notation, gradient-based search mechanism 402 drops the kernel index k since the contributions from different kernels may be summarized. Instead, gradient-based search mechanism 402 only expresses the contribution of the first kernel $\sigma_i$. Gradient-based search mechanism 402 also uses $f_j$ to define the field at location j, such that:

$$f_j = \sum_{i=1}^{MN} \phi_{ij} S_2(\theta_i)$$

Thus:

$$\frac{\partial}{\partial \theta_p} F(\theta) = -2 \sigma_1 S'_2(\theta_p) \sum_{j=1}^{MN} (\hat{z}_j - z_j) S'_1(I_j) \cdot [\phi_{pj} f^*_j + \phi^*_{pj} f_j]$$

By defining an intermediate $C_i$ as:

$$C_i = \sum_{j}^{MN} \phi_{ij} \cdot (\hat{z}_j - z_j) S'_1(I_j) f^*_j$$

gradient-based search mechanism 402 identifies that:

$$\phi_{pj} f^*_j + \phi_{pj}^* f_j = 2 \operatorname{Real}\{\phi_{pj} f^*_j\} = 2 \operatorname{Real}\{\phi_{pj}^* f_j\}$$

In the above calculation, all variables except $C_i$ are either available during the calculation of light intensity or are simple derivatives. By calculating the intermediate term $C_i$ as shown above, gradient-based search mechanism 402 identifies the overall complexity of calculation $C_j$ for each location j is O(MN). Obviously, to calculate the term $C_j$ at all locations, the complexity will become $O(M^2N^2)$.

However, with the similarity of the inner loop between calculating the intermediate term $C_i$ and the light intensity $I_j$, gradient-based search mechanism 402 can thus calculate the term $C_i$ exactly the same way as the calculation of light intensity at location i except that gradient-based search mechanism 402 conjugates the kernel or the filed. Thus, gradient-based search mechanism 402 convolves to a more complicated product, instead of the simple mask. In other words, instead of calculating $C_i$ one by one, gradient-based search mechanism 402 follows the same procedure of convolution and calculates all $C_i$s in one fast Fourier transform (FFT) operation.

Once $C_i$ is known, gradient-based search mechanism 402 calculates an overall derivative as follows:

$$\frac{\partial}{\partial \theta_p} F(\theta) = -4 \sigma_1 S'_2(\theta_p) \operatorname{Real}\{C_p\}$$

In these equations, θ is a specific pixel, σ is the eigenvalue of the kernel, $S'_2$ is a derivative logistic function, p is the mask location, and $C_p$ is the continuous function at location p. The above derivation can be easily extended to the partial coherent case when multiple kernels are involved.

$$\frac{\partial}{\partial \theta_p} F(\theta) = -4 \sum_{k=1}^{m} \sigma_k S'_2(\theta_p) \operatorname{Real}\left\{ \sum_{j}^{MN} \phi_{ijk} \cdot (\hat{z}_j - z_j) S'_1(I_j) f^*_{jk} \right\}$$

Once gradient-based search mechanism 402 has calculated the gradient, then gradient-based search mechanism 402 uses a steepest decent method for optimization. Gradient-based search mechanism 402 calculates an optimization at step w, i.e., $\theta_w$, where w is the index and the optimization goes from step w, to w+1, to w+2, etc., then gradient-based search mechanism 402 updates the mask with the following equation:

$$\theta_{w+1} = \theta_w - \gamma \frac{\partial F(\theta_w)}{\partial \theta}$$

where θ is a specific pixel, where w is an increments step of θ, and where parameter γ is a damping parameter to control the step size.

Thus, since gradient-based search mechanism 402 may dynamically adjust the parameter $\alpha_2$ in the transformation in equation:

$$S_2(\theta; \alpha_2) = \frac{1}{1 + e^{-\alpha_2 \theta}}$$

Then gradient-based search mechanism 402 may perform steepest descent optimization in the inner loop and adjust $\alpha_2$ in the outer loop, until convergence has been achieved by comparing the wafer image generated by the fictitious mask to the given target. Note that eventually gradient-based search mechanism 402 wants the $\alpha_2$ value to be sufficiently large so that the fictitious continuous function is very close to the original discrete optimization function. However, gradient-based search mechanism 402 may also combine two loops into one and start with a small $\alpha_2$ value and, as the steep descent method is reducing the overall objective function F, gradient-based search mechanism 402 gradually increases $\alpha 2$.

Figure 5:
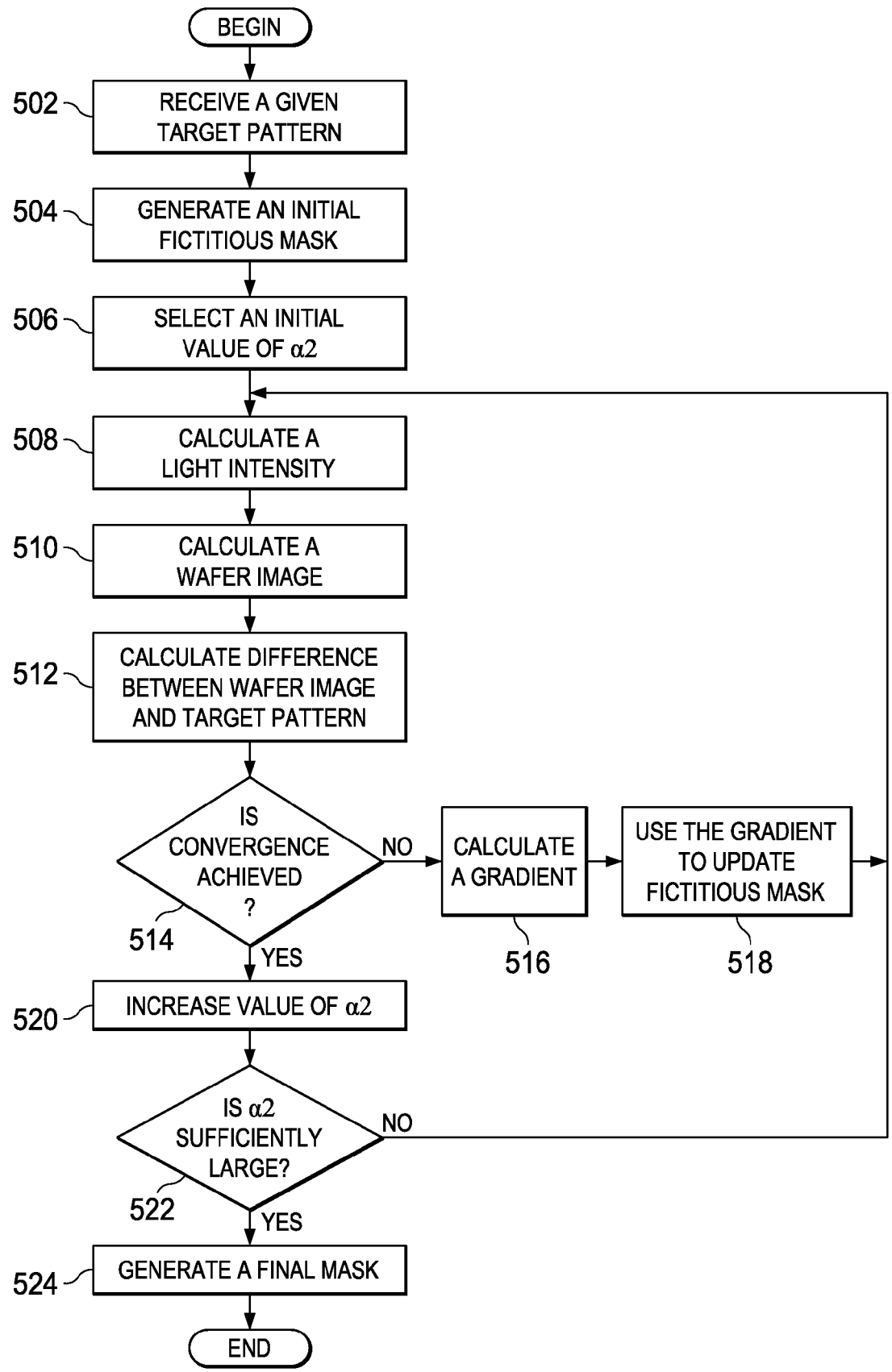
FIG. 5 depicts an exemplary flow diagram of the operation performed by a gradient-based search mechanism in accordance with an illustrative embodiment.

FIG. 5 depicts an exemplary flow diagram of the operation performed by a gradient-based search mechanism in accordance with an illustrative embodiment. As the operation begins, the gradient-based search mechanism initializes and receives a given target pattern (step 502). The gradient based search mechanism then generates an initial fictitious mask (step 504). The gradient-based search mechanism then selects an initial value of $\alpha_2$ (step 506). Using the chosen value of $\alpha_2$, the gradient-based search mechanism calculates a light intensity (step 508) using the following equation:

$$I_j = \sum_{k=1}^{m} \sigma_k \left\| \sum_{i=1}^{MN} \phi_{ijk} S_2(\theta_i) \right\|^2$$

Once the light intensity is calculated, the gradient-based search mechanism calculates a wafer image (step 510) using the following equation:

$$S_1(\theta; \alpha_1, t_r) = \frac{1}{1 + e^{-\alpha_1 \theta + \alpha_1 t_r}}$$

The gradient-based search mechanism then calculates a difference between the wafer image and the target pattern (step 512). Then gradient-based search mechanism determines if convergence is achieved (step 514) using the following formula:

$$F(\theta) = \frac{1}{MN} \sum_{j=1}^{MN} (\hat{z}_j - z_j)^2$$

That is, the convergence is measured by comparing the difference of a given target pattern and the wafer image generated by the fictitious mask. If at step 514 gradient-based search mechanism determines that convergence has failed to be achieved, the gradient-based search mechanism calculates a gradient (step 516) using the following formula:

$$\frac{\partial}{\partial \theta_p} F(\theta) = -4\sigma_1 S_2'(\theta_p) \text{Real}\{C_p\}$$

Using a steepest decent, the gradient-based search mechanism uses the gradient to update the fictitious mask (step 518) using the following formula:

$$\theta_{w+1} = \theta_w - \gamma \frac{\partial F(\theta_w)}{\partial \theta}$$

With the operation retuning to step 508 thereafter. If at step 514 convergence has been achieved, then the gradient-based search mechanism increases the value of $\alpha_2$ (step 520). The gradient based search mechanism then determines if $\alpha_2$ is sufficiently large (step 522). If at step 522 $\alpha_2$ is not sufficiently large, then the operation returns to step 508. If at step 522 $\alpha_2$ is sufficiently large, then the gradient-based search mechanism generates a final mask to use to transfer an image to a wafer (step 524), with the operation terminating thereafter.

Figure 6:
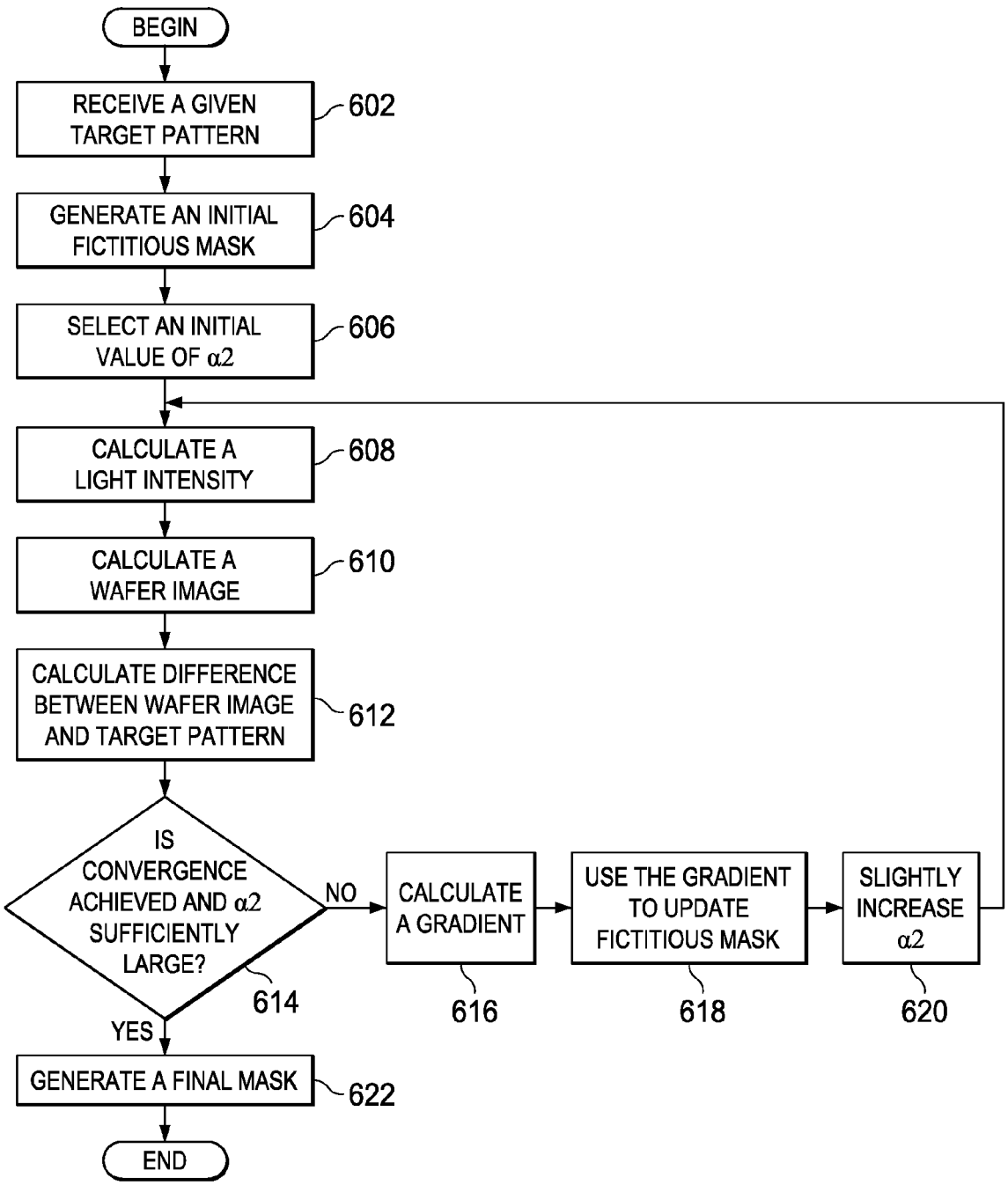
FIG. 6 depicts an alternative exemplary flow diagram of the operation performed by a gradient-based search mechanism in accordance with an illustrative embodiment.

FIG. 6 depicts an alternative exemplary flow diagram of the operation performed by a gradient-based search mechanism in accordance with an illustrative embodiment. As the operation begins, the gradient-based search mechanism initializes and receives a given target pattern (step 602). The gradient based search mechanism then generates an initial fictitious mask (step 604). The gradient-based search mechanism then selects an initial value of $\alpha_2$ (step 606). Using the chosen value of $\alpha_2$, the gradient-based search mechanism calculates a light intensity (step 608) using the following equation:

$$I_j = \sum_{k=1}^{m} \sigma_k \left\| \sum_{i=1}^{MN} \phi_{ijk} S_2(\theta_i) \right\|^2$$

Once the light intensity is calculated, the gradient-based search mechanism calculates a wafer image (step 610) using the following equation:

$$S_1(\theta; \alpha_1, t_r) = \frac{1}{1 + e^{-\alpha_1 \theta + \alpha_1 t_r}}$$

The gradient-based search mechanism then calculates a difference between the wafer image and the target pattern (step 612). Then the gradient-based search mechanism determines if $\alpha_2$ is sufficiently large and convergence is achieved (step 614) using the following formula:

$$F(\theta) = \frac{1}{MN} \sum_{j=1}^{MN} (\hat{z}_j - z_j)^2$$

That is, the convergence is measured by comparing the difference of a given target pattern and the wafer image generated by the fictitious mask. If at step 614 the gradient-based search mechanism determines that convergence has failed to be achieved or $\alpha_2$ is not sufficiently large, then the gradient-based search mechanism calculates a gradient (step 616) using the following formula:

$$\frac{\partial}{\partial \theta_p} F(\theta) = -4\sigma_1 S_2'(\theta_p) \text{Real}\{C_p\}$$

Using a steepest decent, the gradient-based search mechanism uses the gradient to update the fictitious mask (step 618) using the following formula:

$$\theta_{w+1} = \theta_w - \gamma \frac{\partial F(\theta_w)}{\partial \theta}$$

Then the gradient-based search mechanism slightly increases the value of $\alpha_2$ (step 620) with the operation returning to step 608 thereafter. If at step 614 $\alpha_2$ is sufficiently large and convergence has been achieved, then the gradient-based search mechanism generates a final mask to use to transfer an image to a wafer (step 622), with the operation terminating thereafter.

Figure 7A:
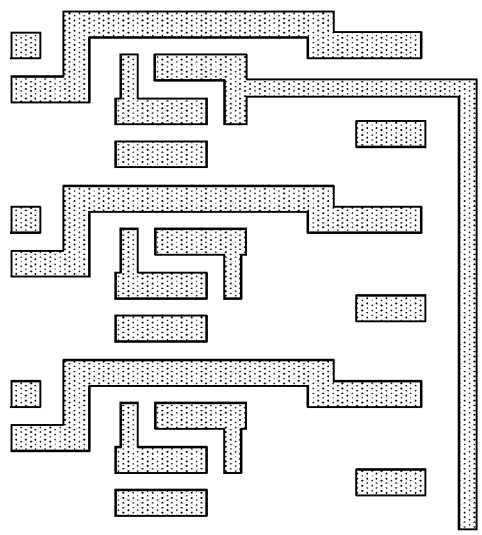
FIGS. 7A-7D depict one example of the optimizing photolithograph masks using a gradient-based search mechanism in accordance with an illustrative embodiment.
Figure 7B:
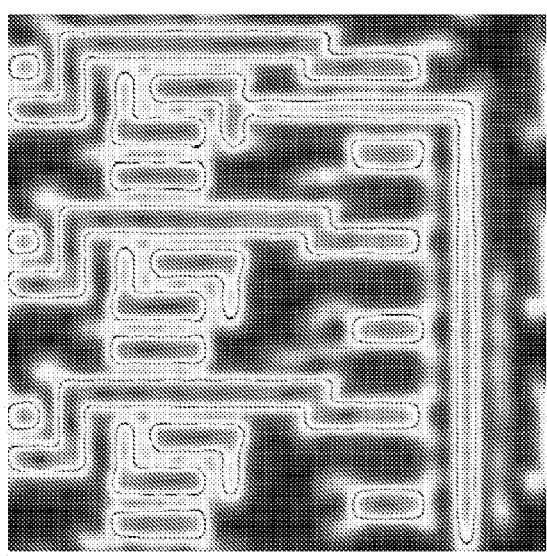
Figure 7C:
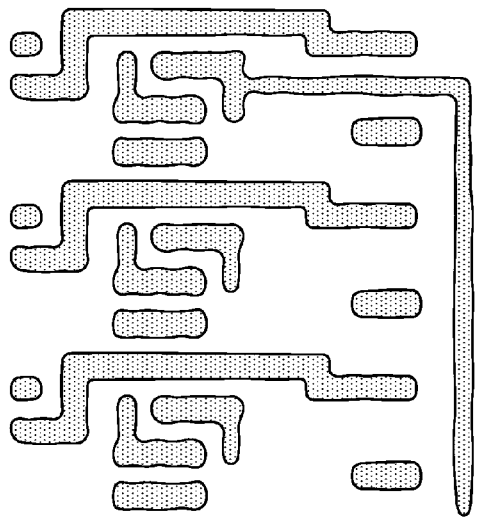
Figure 7D:
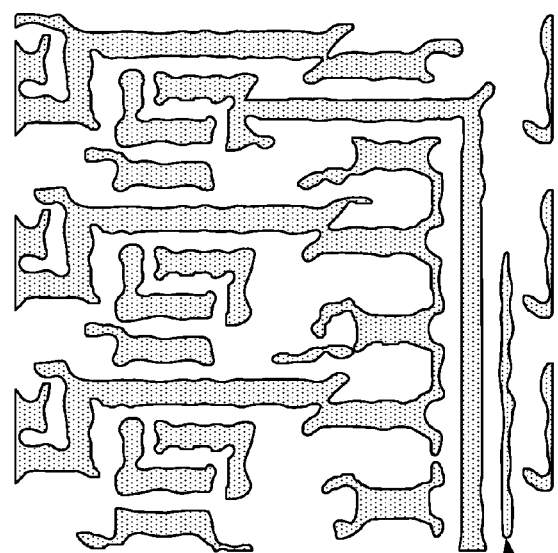

FIGS. 7A-7D depict one example of the optimizing photolithograph masks using a gradient-based search mechanism in accordance with an illustrative embodiment. FIG. 7A shows an intended target. After the gradient-based search mechanism completes the optimization steps described above, the final light intensity on the wafer surface is shown in FIG. 7B, which translates into the final binary wafer image as shown in FIG. 7C. Comparing the intended target, the wafer image in FIG. 7C shows very good fidelity to the intended target in FIG. 7A. FIG. 7D illustrates the mask generated by the gradient-based search mechanism. The thin vertical bar 702 on the right hand side of the FIG. 7D is to facilitate the printing of the true vertical wiring. Vertical bar 702 functions similar to sub-wavelength resolution assist features (SRAF). Gradient-based search mechanism automatically generates vertical bar 702 during optimization to assist with mask generation; however, as shown, the vertical bar does not transfer to the wafer.

Thus, the illustrative embodiments provide mechanisms for general optimization for inverse lithography. The illustrative embodiment applies two transformations to convert the optimization function from discrete domain to continuous domain so that a more efficient gradient searching method can be used. Realistic models (partially coherent) are used for the optical system and an efficient gradient calculation method using fast Fourier transform (FFT) is derived. Furthermore, the proposed transformation enables a gradual morph of the function from continuous to discrete, thus ensuring the optimality of the final solution.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, optimizing a photolithograph mask, the method comprising:
   receiving, by the data processing system, a given target pattern;
   generating, by the data processing system, an initial fictitious mask;
   selecting, by the data processing system, an initial value of $\alpha_2$, wherein the initial value of $\alpha_2$ is used to determine a light intensity and a wafer image;
   determining, by the data processing system, the light intensity for each pixel in the initial fictitious mask;
   determining, by the data processing system, the wafer image for each pixel in the initial fictitious mask;
   determining, by the data processing system, if a convergence has been achieved by comparing the wafer image generated from the initial fictitious mask to the given target pattern; and
   responsive to a convergence of the wafer image generated from the initial fictitious mask to the given target pattern, generating, by the data processing system, a final mask to use to transfer an image to a wafer, wherein the final mask is generated using the following formula:

$$\theta_{w+1} = \theta_w - \gamma \left( \frac{\partial}{\partial \theta} F(\theta_w) \right)$$

wherein $\theta$ is a specific pixel, wherein w is an increment step of $\theta$, wherein $\gamma$ is a damping parameter to control a size of the increment step w, wherein $$\frac{\partial}{\partial \theta}$$

is a mathematical process for applying a derivative with respect to the specific pixel $\theta$, and wherein F is a mathematical symbol for a function of the specific pixel $\theta$ at the increment step w.

2. A computer program product comprising a non-transitory computer recordable medium having a computer readable program recorded thereon, wherein the computer readable program, when executed on a computing device, causes the computing device to:
   receive a given target pattern;
   generating an initial fictitious mask;
   select an initial value of $\alpha_2$, wherein the initial value of $\alpha_2$ is used to determine a light intensity and a wafer image;
   determine the light intensity for each pixel in the initial fictitious mask;
   determine the wafer image for each pixel in the initial fictitious mask;
   determine if a convergence has been achieved by comparing the wafer image generated from the initial fictitious mask to the given target pattern; and
   responsive to a convergence of the wafer image generated from the initial fictitious mask to the given target pattern, generate a final mask to use to transfer an image to a wafer, wherein the computer readable program to determine the final mask uses the following Formula:

$$\theta_{w+1} = \theta_w - \gamma \left( \frac{\partial}{\partial \theta} F(\theta_w) \right)$$

wherein θ is a specific pixel, wherein w is an increment step of θ, wherein γ is a damping parameter to control a size of the increment step w, wherein $$\frac{\partial}{\partial \theta}$$

is a mathematical process for applying a derivative with respect to the specific pixel θ, and wherein F is a mathematical symbol for a function of the specific pixel θ at the increment step w.

3. An apparatus, comprising:
a processor; and
a memory coupled to the processor, wherein the memory comprises instructions which, when executed by the processor, cause the processor to:
receive an initial photolithograph mask and a given target pattern;
generate an initial fictitious mask;
select an initial value of $\alpha_2$, wherein the initial value of $\alpha_2$ is used to determine a light intensity and a wafer image;
determine the light intensity for each pixel in the initial fictitious mask;
determine the wafer image for each pixel in the initial fictitious mask;
determine if a convergence has been achieved by comparing the wafer image generated from the initial fictitious mask to the given target pattern; and
responsive to a convergence of the wafer image generated from the initial fictitious mask to the given target pattern, generate a final mask to use to transfer an image to a wafer, wherein the instructions to determine the final mask uses the following formula:

$$\theta_{w+1} = \theta_w - \gamma\left(\frac{\partial}{\partial \theta}F(\theta_w)\right)$$

wherein θ is a specific pixel, wherein w is an increment step of θ, wherein γ is a damping parameter to control a size of the increment step w, wherein $$\frac{\partial}{\partial \theta}$$

is a mathematical process for applying a derivative with respect to the specific pixel θ, and wherein F is a mathematical symbol for a function of the specific pixel θ at the increment step w.

* * * * *